(12) United States Patent
Itakura et al.

(10) Patent No.: US 9,052,556 B2
(45) Date of Patent: Jun. 9, 2015

(54) DISPLAY DEVICE

(71) Applicants: Japan Display Inc., Tokyo (JP); Panasonic Liquid Crystal Display Co., Ltd., Hyogo-ken (JP)

(72) Inventors: Hirokazu Itakura, Ootaki (JP); Hitoshi Komeno, Mobara (JP); Tomoaki Takahashi, Mobara (JP)

(73) Assignees: Japan Display, Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days.

(21) Appl. No.: 14/254,405

(22) Filed: Apr. 16, 2014

(65) Prior Publication Data

US 2014/0226098 A1 Aug. 14, 2014

Related U.S. Application Data

(63) Continuation of application No. 14/032,432, filed on Sep. 20, 2013, now Pat. No. 8,704,967, which is a continuation of application No. 13/783,818, filed on Mar. 4, 2013, now Pat. No. 8,547,494, which is a continuation of application No. 13/605,280, filed on Sep. 6, 2012, now Pat. No. 8,390,754, which is a continuation of application No. 12/618,843, filed on Nov. 16, 2009, now Pat. No. 8,284,341.

(30) Foreign Application Priority Data

Nov. 18, 2008 (JP) .................................. 2008-294843

(51) Int. Cl.
*G02F 1/1333* (2006.01)
*G02F 1/1343* (2006.01)
(Continued)

(52) U.S. Cl.
CPC ...... *G02F 1/134363* (2013.01); *G02F 1/13454* (2013.01); *G02F 1/136204* (2013.01); *G02F 1/136286* (2013.01); *G02F 1/13439* (2013.01)

(58) Field of Classification Search
CPC .......... G02F 1/136204; G02F 1/13454; G02F 1/134363; G02F 1/13439; G02F 1/136286; G02F 1/1345; G02F 1/13452; G02F 2202/22; G09G 2300/0426; G09G 2330/04; G09G 3/3648
USPC ......... 349/43, 50, 40, 140, 54, 139, 138, 141, 349/143, 41, 59, 149; 257/355, 72, 257/E27.111, E29.273
See application file for complete search history.

(56) References Cited

U.S. PATENT DOCUMENTS 5,936,687 A * 8/1999 Lee .................................. 349/40
6,801,288 B1 10/2004 Ashizawa et al.
(Continued)

FOREIGN PATENT DOCUMENTS

JP 11-95260 4/1999
JP 2004-126276 4/2004
(Continued)

OTHER PUBLICATIONS

Office Action in connection with copending U.S. Appl. No. 13/296,259, mailed Sep. 16, 2014.

*Primary Examiner* — Thoi Duong
(74) *Attorney, Agent, or Firm* — Lowe Hauptman & Ham, LLP

(57) ABSTRACT

A display device includes a substrate, a display region, a peripheral region, an insulating layer which is disposed on a gate signal line and a conductor, a conductive layer which is disposed on the insulating layer and crosses a plurality of gate signal lines and the conductor in the peripheral region, a first semiconductor film which is disposed between the insulating layer and the conductive layer, and a second semiconductor film which is disposed between the insulating layer and the conductive layer and which is separated from the first semiconductor film. The conductive layer is connected to the plurality of gate signal lines via a plurality of diodes, and the plurality of gate signal lines are arranged in the display region and the peripheral region. A length of the conductor differs from a length of the gate signal line in the display region and the peripheral region.

8 Claims, 7 Drawing Sheets

(51) Int. Cl.
*G02F 1/1362* (2006.01)
*G02F 1/1345* (2006.01)

(56) References Cited

U.S. PATENT DOCUMENTS

| | | | |
|---|---|---|---|
| 7,417,693 B2 * | 8/2008 | Kawasaki | 349/43 |
| 7,619,696 B2 * | 11/2009 | Ota | 349/40 |
| 2004/0125256 A1 | 7/2004 | Park et al. | |
| 2006/0145951 A1 | 7/2006 | Watanabe et al. | |

FOREIGN PATENT DOCUMENTS

| | | |
|---|---|---|
| JP | 2004-212951 | 7/2004 |
| JP | 2004-317685 | 11/2004 |
| JP | 2006-517678 | 7/2006 |
| JP | 2007-42775 | 2/2007 |
| JP | 2008-53517 | 3/2008 |

* cited by examiner

DISPLAY DEVICE

CROSS-REFERENCE TO RELATED APPLICATION

This application is a continuation of U.S. application Ser. No. 14/032,432, filed Sep. 20, 2013, now U.S. Pat. No. 8,704,967, which is a continuation of U.S. application Ser. No. 13/783,818, filed Mar. 4, 2013, now U.S. Pat. No. 8,547,494, which is a continuation of U.S. application Ser. No. 13/605,280, filed Sep. 6, 2012, now U.S. Pat. No. 8,390,754, which is a continuation of U.S. application Ser. No. 12/618,843, filed Nov. 16, 2009 now U.S. Pat. No. 8,284,341, the contents of which are incorporated herein by reference.

The present application claims priority from Japanese application JP 2008-294843 filed on Nov. 18, 2008, the content of which is hereby incorporated by reference into this application.

BACKGROUND OF THE INVENTION

1. Field of the Invention

The present invention relates to a display device.

2. Description of the Related Art

In display devices such as, for example, liquid crystal display devices, circuits above an array substrate constituting the display device are sometimes broken due to static electricity occurring during the production or other times of the display device. For coping with this problem, a metal film is generally patterned above the array substrate to form a ground wire for dissipating the static electricity generated in the circuits.

Further, since a high-voltage current may flow through a ground wire, it is preferable to increase withstand voltage characteristics (to alleviate the influence of potential difference) between the ground wire and a wire located below the ground wire and crossing the ground wire in a plan view. There exists a display device in which a semiconductor film extending so as to overlap the ground wire is formed under the ground wire for improving the withstand voltage characteristics.

JP-A-2007-42775 is a document relating to the invention and discloses a configuration which dissipates static electricity generated on a wire by forming a ground wire.

SUMMARY OF THE INVENTION

In the display device in which a semiconductor film extending so as to overlap the ground wire is formed under the ground wire, when the configuration of the wire crossing the ground wire is changed for improving the circuit configuration, the circuit is sometimes broken due to electrostatic discharge caused by the relationship between the circuit configuration and the semiconductor film. Hereinafter, the situation where the problem occurs will be described by using an IPS (In-Plane Switching) type liquid crystal display device as an example with reference to FIGS. 5 to 8.

FIG. 5 is a partial plan view of an array substrate for illustrating a subject of the invention, showing an example of the configuration when the problem of the electrostatic discharge occurs. FIG. 5 shows peripheral circuits including a ground wire PE on the left of a display region of a liquid crystal display device in an enlarged manner, showing circuits corresponding to two rows of pixel array. A video signal line IL extending in the vertical direction near the right end in the drawing shows the left end of the display region. The display region of the array substrate of the liquid crystal display device lies on the right of the video signal line IL. The plurality of pixel circuits are arranged in the display region. A region (frame region) surrounding the display region lies on the left of the video signal line IL. The gate signal line GL extends in the horizontal direction in the central and upper areas in the drawing. The gate signal line GL extends from the frame region to cross the video signal line IL and further extends from the right end in the drawing in the display region. A common connection line CCL which is adjacent to each of the gate signal lines GL on the upper side in the drawing also extends from the left to the right in the frame region and is connected to a common connection electrode CCE before the video signal line IL. The common connection electrode CCE is disposed so as to correspond to the common connection line CCL. The common connection electrode CCE extends upward in the drawing from a point where the common connection electrode CCE is connected to the common connection line CCL along with the video signal line IL before the upper gate signal line GL. The gate signal line GL, the common connection line CCL, and the common connection electrode CCE are formed in the same layer (first conductive layer) on an insulating substrate SUB constituting the array substrate.

The ground wire PE extends vertically across the central area in the drawing. The video signal line IL and the ground wire PE are formed in a layer (second conductive layer) on a gate insulating film GI formed on the first conductive layer. Below the ground wire PE, an inter-wiring semiconductor film SP extends in the same direction as the ground wire PE. The inter-wiring semiconductor film SP overlaps the ground wire PE in a plan view. The inter-wiring semiconductor film SP is formed such that the width thereof is greater than that of the ground wire PE at a portion which crosses the gate signal line GL or the common connection line CCL and smaller than that of the ground wire PE at other portions. The ground wire PE is wider than the video signal line IL.

In FIG. 5, the common connection electrode CCE is connected to a common electrode CT through a contact hole. The common electrode CT crosses over the video signal line IL to extend in the display region. The gate signal line GL is electrically connected to the ground wire PE through protective diodes PD1 and PD2.

FIG. 6 is a cross-sectional view taken along the line A-A in FIG. 5, showing a cross sectional structure of a ground wire portion. The first conductive layer in which the common connection line CCL and the gate signal line GL are formed lies on the insulating substrate SUB. On the first conductive layer, a layer of the gate insulating film GI, a layer in which a semiconductor film SLE is formed, a layer in which an impurity-doped semiconductor film DLE is formed, the second conductive layer in which the ground wire PE is formed, and a layer of an inter-layer insulating film MI are stacked in this order. The semiconductor film SLE and the impurity-doped semiconductor film DLE constitute the inter-wiring semiconductor film SP.

In the circuit having the configuration shown in FIGS. 5 and 6, static electricity sometimes accumulates on the wires or the like due to the manufacturing process such as etching which is performed above the first conductive layer. Especially when the semiconductor film is etched using plasma ions, static electricity tends to accumulate on the wires because the array substrate is irradiated with ions.

FIG. 7 illustrates an etching process in the array substrate in the subject of the invention. FIG. 7 shows a state of the circuit shown in FIG. 5 in the course of the production thereof. FIG. 7 shows a state where a layer of a metal film is stacked on the insulating substrate SUB, the gate signal line GL, the common connection line CCL, or the like is patterned, a layer of the gate insulating film GI, a layer in which the semiconductor film SLE or the like is formed, and a layer in which the impurity-doped semiconductor film DLE or the like is formed, and the impurity-doped semiconductor film DLE, the semiconductor film SLE, and the like are patterned by etching. As is apparent from FIG. 7, when plasma etching is performed on the semiconductor film, static electricity accumulates on the gate signal line GL and the common connection line CCL below the semiconductor film. The gate signal line GL is a wire which extends from the frame region to the opposite end of the display region. The common connection line CCL is a wire which extends in the frame region but is not formed in the display region. As is apparent from FIG. 7, therefore, the wiring length of the gate signal line GL is remarkably longer than that of the common connection line CCL (at least 10 times or more). Therefore, static electricity tends to accumulate more on the gate signal line GL having the longer wiring length due to the influence of plasma ions in etching.

When the amount of electric charge accumulated due to static electricity varies, potential difference occurs. In the case of FIG. 5, potential difference occurs between the gate signal line GL and the common connection line. Electrostatic discharge occurs between the common connection line CCL and the gate signal line GL in FIG. 6, whereby the circuit is broken. The route of electrostatic discharge does not extend in the horizontal direction of the gate insulating film GI at the shortest distance but goes through the semiconductor film SLE and the impurity-doped semiconductor film DLE on the gate insulating film GI.

On the other hand, FIG. 8 illustrates an etching process in a conventional array substrate. FIG. 8 shows a state of circuits of a conventional IPS or TN type liquid crystal display device in the course of the production of them, especially showing the vicinity of the ground wire PE in an enlarged manner. Similarly to FIG. 7, FIG. 8 shows a state where the gate signal line GL or the common connection line CCL are patterned, the layer of the gate insulating film GI, the layer in which the semiconductor film SLE is formed, and the layer in which the impurity-doped semiconductor film DLE or the like is formed are stacked and etched using plasma ions. FIG. 8 differs from FIG. 7 in that a metal wire ML corresponding to the common connection line in FIG. 7 extends from the frame region to the opposite end of the display region similarly to the gate signal line GL. Therefore, the wiring lengths of the gate signal line GL and the metal wire ML are substantially the same. In this case, even when electric charge accumulates on the gate signal line GL and the metal wire ML, the electric charge accumulates on them in substantially the same manner. Therefore, the difference of the amount of electric charge accumulated on the gate signal line GL and on the metal wire ML is limited, whereby electrostatic discharge does not occur. The metal wire ML corresponds to a common signal line in the case of an IPS type liquid crystal display device while corresponding to a storage line in the case of a TN type liquid crystal display device.

That is, in the configuration shown in FIG. 7, since the wiring lengths of the common connection line CCL and the gate signal line GL adjacent thereto are remarkably different, electric charge tends to accumulate nonuniformly such that the electric charge accumulates more on the gate signal line GL when etching is performed on the semiconductor layer or the like. In addition, when the semiconductor film which extends so as to overlap the ground wire is formed below the ground wire so as to connect the common connection line CCL with the gate signal line GL adjacent thereto, electro-static discharge occurs before the formation of the ground wire to cause a problem that the circuit is broken.

The invention has been made in view of the above problem, and an object of the invention is to provide a display device which prevents the breakage of a circuit due to electrostatic discharge in an etching process before the formation of a ground wire.

Typical outlines of the invention disclosed herein will be briefly described below.

(1) A display device includes: on an insulating substrate, a first conductive layer in which a first signal line and a second signal line adjacent to the first signal line are formed; an insulating layer which is disposed on the first conductive layer; a second conductive layer which is disposed on the insulating layer and in which a ground wire crossing the first signal line and the second signal line in a plan view is formed; and a semiconductor layer which is disposed between the insulating layer and the second conductive layer and in which a first semiconductor film and a second semiconductor film are formed to overlap the ground wire in a plan view while being separated from each other, wherein the wiring lengths of the first signal line and the second signal line are different by at least 10 times or more, the first semiconductor film overlaps, in a plan view, a region where the first signal line crosses the ground wire, and the second semiconductor film overlaps, in a plan view, a region where the second signal line crosses the ground wire.

(2) In the display device according to (1), the first semiconductor film and the second semiconductor film each include a semiconductor film doped with an impurity.

(3) In the display device according to (1) or (2), the insulating substrate has a display region where a plurality of pixel circuits corresponding to pixels are arranged and a frame region surrounding the display region, the first signal line extends both in the frame region and in the display region, and the second signal line extends in the frame region but is not formed in the display region.

(4) In the display device according to (3), the second signal line is connected to a transparent electrode which is formed above the second conductive layer and extends from the frame region to the display region.

(5) In the display device according to any one of (1) to (4), the first semiconductor film does not overlap, in a plan view, a wire other than the ground wire and the first signal line in the first conductive layer, and the second semiconductor film does not overlap, in a plan view, the wire other than the ground wire and the second signal line in the first conductive layer.

According to the invention, it is possible to prevent the breakage of a circuit due to electrostatic discharge in an etching process of a semiconductor film or the like.

DESCRIPTION OF THE PREFERRED EMBODIMENT

Hereinafter, an embodiment of the invention will be described in detail based on the drawings. A display device according to the embodiment is an IPS (In-Plane Switching) type liquid crystal display device, including an array substrate, a filter substrate (also referred to as counter substrate) which faces the array substrate and provided with color filters, a liquid crystal material which is sealed in a space between the substrates, and a driver IC attached to the array substrate. The array substrate and the filter substrate are both glass substrates or the like.

Figure 1:
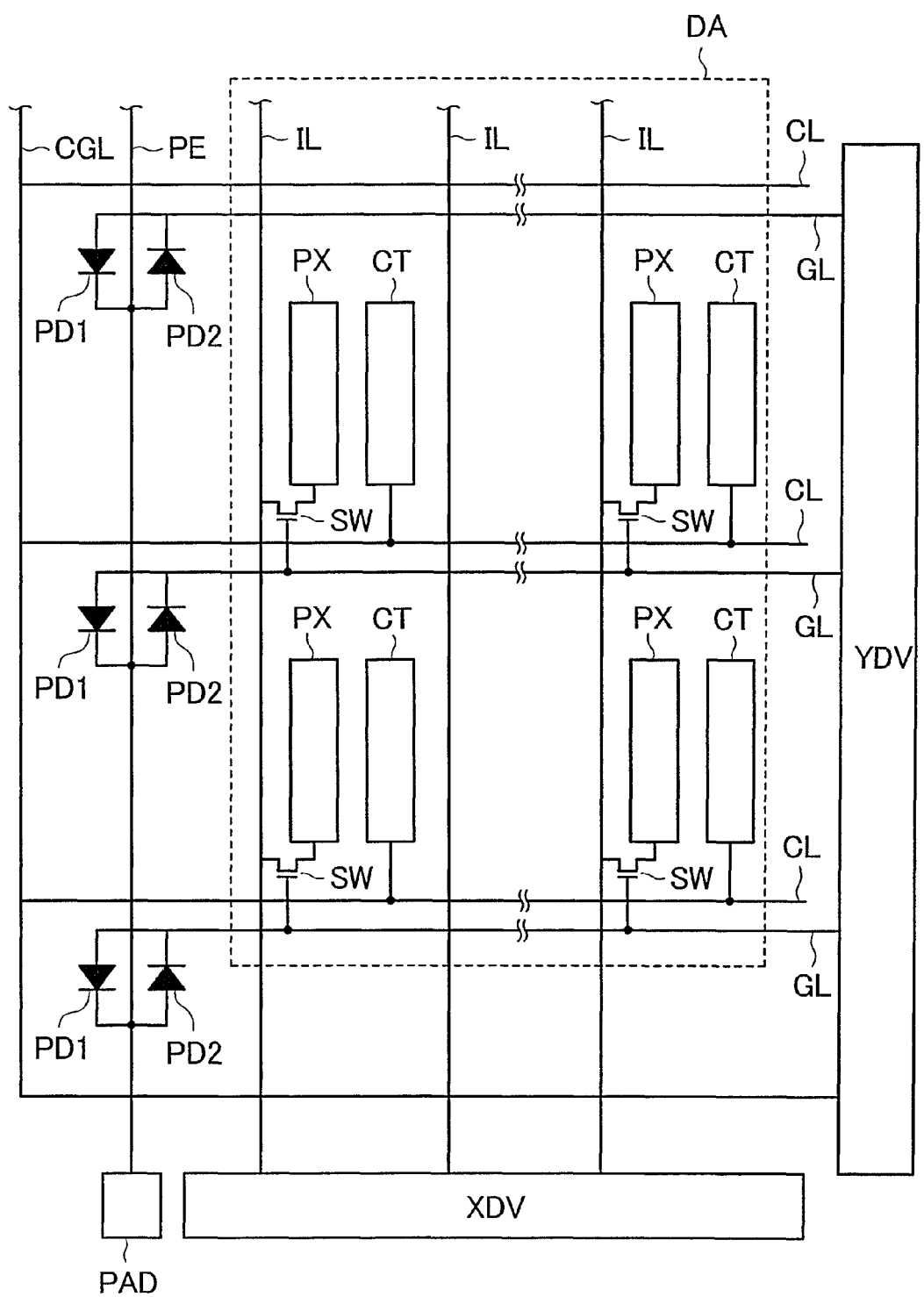
FIG. 1 shows a display region and equivalent circuits in the peripheral region of the display region of an array substrate according to an embodiment of the invention.

FIG. 1 shows a display region DA and equivalent circuits in the peripheral region of the display region of the array substrate according to the embodiment. In the display region DA of the array substrate, a number of gate signal lines GL are aligned in parallel, extend in the horizontal direction, and are connected to a gate signal line drive circuit YDV outside the display region DA on the right in the drawing. A number of video signal lines IL are also aligned in parallel, extend in the vertical direction, and are connected to a video signal line drive circuit XDV outside the display region DA. The display region DA is partitioned into a matrix by the gate signal lines GL and the video signal lines IL. Each of the partitioned regions constitutes one pixel region. A pixel circuit is formed in each of the pixel regions. A common signal line CL extends in the horizontal direction so as to correspond to each of the gate signal lines GL. The common signal lines CL are connected to one common collective line CGL which extends in the vertical direction outside the display region on the left in the drawing. The common collective line CGL is connected to the gate signal line drive circuit YDV outside the display region DA.

A pixel switch SW is arranged in each of the pixel circuits so as to correspond to a location where the gate signal line GL crosses the video signal line IL. The pixel switch SW is a so-called thin film transistor. A gate electrode of the pixel switch SW is connected to the gate signal line GL, and a drain electrode of the pixel switch SW is connected to the video signal line IL. In each of the pixel circuits, a pixel electrode PX and a common electrode CT are formed in pair. The pixel electrode PX is connected to a source electrode of the pixel switch SW. The common electrode CT is connected to the common signal line CL. The source electrode and drain electrode of the pixel switch SW are determined depending on the polarity of a signal input thereto. In the liquid crystal display device, both polarities are possible. Therefore, the source electrode and drain electrode of the pixel switch SW are determined as described above for the sake of convenience. The common electrode CT and the common signal line CL may be integrally formed. The common signal line CL serving also as the common electrode CT may be formed in each row or integrally formed over a plurality of rows.

A ground wire PE extends in the vertical direction in the drawing outside the display region DA on the left in the drawing and on the right of the common collective line CGL, and is connected to a ground terminal PAD in the lower area in the drawing. The ground wire PE is connected to each of the gate signal lines GL via protective diodes PD1 and PD2. Specifically, the protective diode is a diode-connected thin film transistor. The thin film transistor is formed such that the threshold voltage thereof is higher than that of the thin film transistor used in the pixel circuit, and therefore is not turned on with the voltage of a signal current flowing through the gate signal line GL. The protective diode PD1 and the protective diode PD2 are different in polarity from each other. Current flows in a direction from the gate signal line GL to the ground wire PE in the protective diode PD1, while flowing in a direction from the ground wire PE to the gate signal line GL in the protective diode PD2.

In the above circuit configuration, a reference voltage is applied to the common electrode CT of each pixel via the common signal line CL. A pixel row is selected by applying a gate voltage to the gate signal line GL. A video signal is supplied to each of the video signal lines IL at the timing of the selection, whereby the voltage of a video signal is applied to the pixel electrode PX of each pixel. This generates a lateral electric field having an intensity corresponding to the voltage of the video signal between the pixel electrode PX and the common electrode CT. The orientation of liquid crystal molecules is determined in accordance with the intensity of the lateral electric field.

The protective diodes PD1 and PD2 maintain the potential difference between the gate signal line GL and the ground wire PE at a constant range. When a constant potential is supplied from the ground terminal PAD during the production or usage, the potential of the gate signal line GL is maintained at a constant range. Therefore, the breakage of the circuit can be prevented after the formation of the protective diode.

In FIG. 1, although only two times two or four pixel circuits are shown for facilitating the description, there are actually three times as many pixel circuits as the number of pixels arranged in a matrix in the display region. The number is tripled because three pixel circuits of RGB are required for each pixel.

Figure 2:
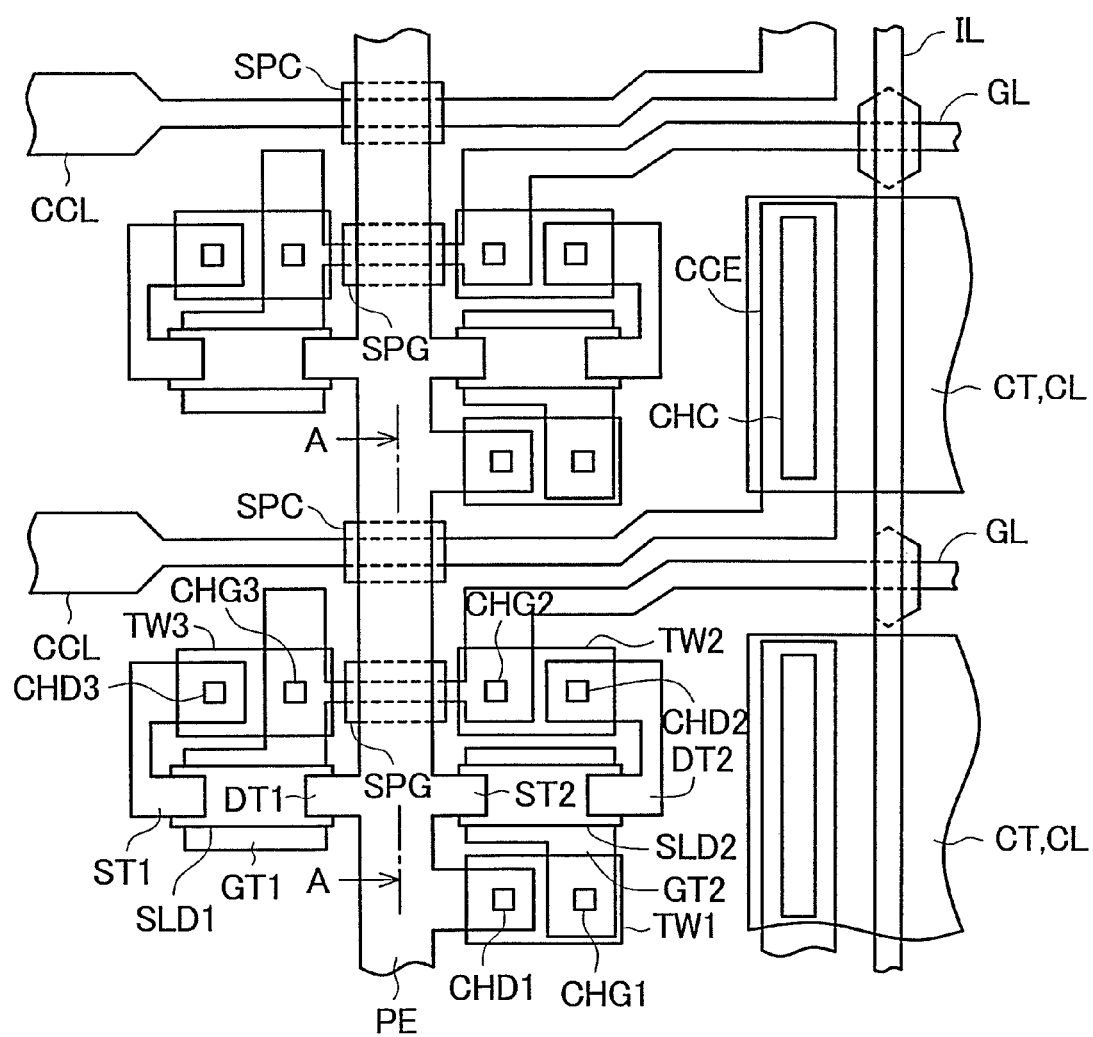
FIG. 2 is a partial plan view showing the vicinity of a ground wire PE of the array substrate according to the embodiment.

FIG. 2 is a plan view showing the vicinity of the ground wire PE of the array substrate according to the embodiment, showing a portion of a frame region on the left of the display region DA in an enlarged manner. The frame region is a region surrounding the display region DA. In FIG. 2, circuits corresponding to two rows of the pixel circuit array are shown. The video signal line IL extending in the vertical direction near the right end in the drawing shows the left end of the display region DA. The display region DA of the array substrate of the liquid crystal display device lies on the right of the video signal line IL. The plurality of pixel circuits are arranged in the display region DA. The frame region lies on the left of the video signal line IL. The gate signal line GL extends in the horizontal direction in the central and upper areas in the drawing. A common connection line CCL which is adjacent to each of the gate signal lines GL on the upper side in the drawing also extends in the horizontal direction. The gate signal line GL, the common connection line CCL, and a common connection electrode CCE are formed in the same layer (first conductive layer) on an insulating substrate SUB constituting the array substrate.

The ground wire PE extends vertically across the central area in the drawing. The video signal line IL and the ground wire PE are formed in a layer (second conductive layer) on a gate insulating film GI formed on the first conductive layer.

The common connection line CCL will be specifically described below. In FIG. 2, the common connection electrode CCE which extends in parallel with the video signal line IL toward the gate signal line GL extending horizontally in the central area in the drawing is located on the lower side of the gate signal line GL (corresponding to the upper pixel circuit) extending horizontally in the upper area in the drawing and at the right end of the frame region. The common connection electrode CCE extends before the gate signal line GL extending horizontally in the central area in the drawing and is connected to the common connection line CCL there. The common connection line CCL extends leftward in the drawing from the location where the common connection line CCL is connected to the common connection electrode CCE, extends slightly toward the lower left direction in the drawing along the way, and further extends leftward in the drawing. The common connection line CCL crosses below the ground wire PE, extends leftward in the drawing, and is connected to the not-shown common collective line CGL at the left end of the frame region.

The common connection line CCL crosses the ground wire PE as viewed in a plan view. An inter-wiring semiconductor film SPC (second semiconductor film) is formed between the common connection line CCL (to be more accurate, the gate insulating film GI on the common connection line CCL) and the ground wire PE so as to overlap the crossing region in a plan view.

The common connection electrode CCE is connected to the common electrode CT (the common signal line CL) located above the ground wire PE or the video signal line IL via a contact hole CHC. The common electrode CT crosses over the video signal line IL to extend in the display region. The common electrode CT is a transparent electrode. The common electrode CT, which is disposed so as to horizontally cross the pixel regions arranged in the horizontal direction, is a part of the common signal line CL shown in FIG. 1. The common connection line CCL is a part of the common signal line CL although being formed in a different layer from the common electrode CT.

The gate signal line GL extends from the frame region to cross the video signal line IL and further extends from the right end in the drawing in the display region DA. The wiring structure of the gate signal line GL in the frame region will be specifically described below with the display region DA side as the starting point. The gate signal line GL extends from the display region DA on the right in the drawing to cross below the video signal line IL and enters the frame region. The video signal line IL crosses the gate signal line GL. After entering the frame region, the gate signal line GL extends leftward in the drawing while being adjacent to the common connection line CCL. The gate signal line GL extends slightly toward the lower left direction in the drawing in accordance with the curve of the common connection line along the way and thereafter extends further leftward in the drawing. The gate signal line GL is separated from the common connection line CCL before the ground wire PE and extends downward in the drawing. A contact hole CHG2 is formed on a further extending portion of the gate signal line GL. The bottom of the contact hole CHG2 reaches the gate signal line GL. The gate signal line GL faces leftward in the drawing from the place where the contact hole CHG2 is formed and crosses below the ground wire PE. The gate signal line GL and the ground wire PE are at right angles to each other as viewed in a plan view. A contact hole CHG3 is formed on a portion of the gate signal line GL extending after crossing the ground wire PE. The bottom of the contact hole CHG3 reaches the gate signal line GL. The gate signal line is branched into upper and lower portions at the place where the contact hole CHG3 is formed. The upper portion extends upward in the drawing before the common connection line CCL. The lower portion extends downward in the drawing and then bends to the left in the drawing. The bent portion serves as a gate electrode GT1 of the protective diode PD1. The ground wire PE is wider than the video signal line IL.

The gate signal line GL and the ground wire PE are at right angles as viewed in a plan view. An inter-wiring semiconductor film SPG (first semiconductor film) is formed between the gate signal line GL (to be more accurate, the gate insulating film GI on the gate signal line GL) and the ground wire PE so as to overlap the region where the gate signal line GL and the ground wire PE are at right angles.

The gate signal line GL is electrically connected to the ground wire PE through the protective diodes PD1 and PD2. Specifically, the protective diode PD1 is formed of a channel semiconductor film SLD1, a drain electrode DT1, a source electrode ST1, and the gate electrode GT1. The channel semiconductor film SLD1 is formed above the gate electrode GT1. The drain electrode DT1 is connected to an upper surface of the channel semiconductor film SLD1 at the right end, extends rightward, and is connected to the ground wire PE. The source electrode ST1 is connected to an upper surface of the channel semiconductor film SLD1 at the left end, extends leftward, and then bends upward. Thereafter, the source electrode ST1 bends toward the contact hole CHG3. A contact hole CHD3 is formed on the bent portion. The bottom of the contact hole CHD3 reaches the source electrode ST1. The source electrode ST1 and the gate signal line GL are connected to each other through a transparent electrode TW3 disposed so as to cover both the contact hole CHD3 and the contact hole CHG3. This structure forms a diode-connected thin film transistor in which the gate electrode GT1 and the source electrode ST1 are connected together with the gate signal line GL.

The protective diode PD2 is formed of a channel semiconductor film SLD2, a drain electrode DT2, a source electrode ST2, and a gate electrode GT2. The drain electrode DT2 is a wire formed in the same layer as the ground wire PE. The drain electrode DT2 extends rightward in the drawing from a contact hole CHD2 formed on the right of the contact hole CHG2, bends downward in the drawing and further extends, and further bends to the left in the drawing. The contact hole CHD2 reaches the drain electrode DT2. The drain electrode DT2 is connected at a lower surface of a further extending portion thereof to an upper surface of a channel semiconductor film SLD2 at the right end. The channel semiconductor film SLD2 extends from the place where the channel semiconductor film SLD2 is connected to the drain electrode DT2 toward the ground wire PE on the left in the drawing and is connected at an upper surface on the left end to the source electrode ST2 extending from the ground wire PE to the right in the drawing. The gate electrode GT2 is located in the same layer as the gate electrode GT1. The gate electrode GT2 extends downward from the right end portion thereof which overlaps the channel semiconductor film SLD2 in a plan view. A contact hole CHG1 is formed on a further extending portion of the gate electrode GT2. The contact hole CHG1 reaches the gate electrode GT2. A branch extends from the ground wire PE to the right in the drawing on the left of the contact hole CHG1. A contact hole CHD1 is formed on the branch. The contact hole CHD1 reaches the ground wire PE. The gate signal line GL and the drain electrode DT2 are connected to each other through a transparent electrode TW2 which covers the contact hole CHG2 and the contact hole CHD2. The gate electrode GT2 and the ground wire PE are connected to each other through a transparent electrode TW1 which covers the contact hole CHD1 and the contact hole CHG1. This structure forms a diode-connected thin film transistor in which the gate electrode GT2 and the source electrode ST2 are connected together with the ground wire PE.

Figure 3:
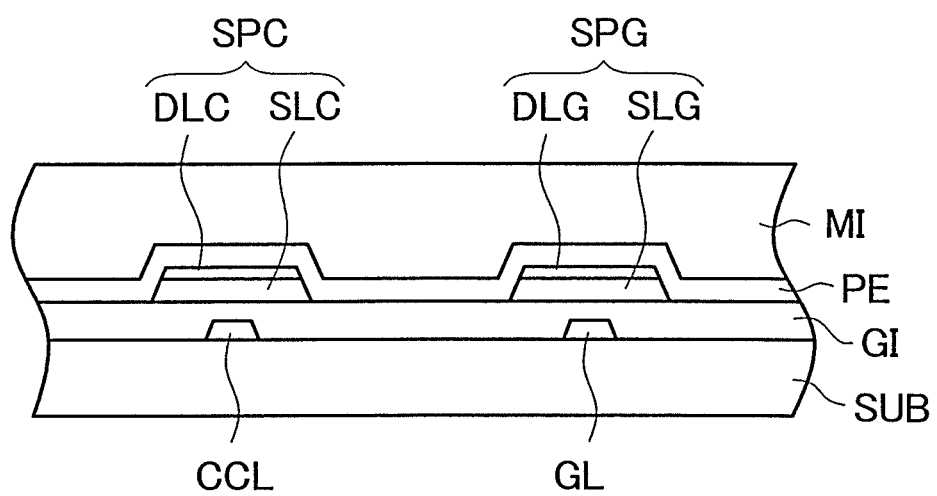
FIG. 3 is a cross-sectional view taken along the line A-A in FIG. 2.

FIG. 3 is a cross-sectional view taken along the line A-A in FIG. 2, showing a cross sectional structure of the ground wire portion. The first conductive layer in which the common connection line CCL and the gate signal line GL are formed lies on the insulating substrate SUB. On the first conductive layer, a layer of the gate insulating film GI, a layer in which a semiconductor film SLC overlapping the common connection line CCL in a plan view and a semiconductor film SLG overlapping the gate signal line GL in a plan view are formed, a layer in which an impurity-doped semiconductor film DLC in contact with an upper surface of the semiconductor film SLC and an impurity-doped semiconductor film DLG in contact with an upper surface of the semiconductor film SLG are formed, the second conductive layer in which the ground wire PE is formed, and an layer of an inter-layer insulating film MI are stacked in this order. The semiconductor film SLC and the impurity-doped semiconductor film DLC constitute the inter-wiring semiconductor film SPC. The semiconductor film SLG and the impurity-doped semiconductor film DLG constitute the inter-wiring semiconductor film SPG.

Figure 4A:
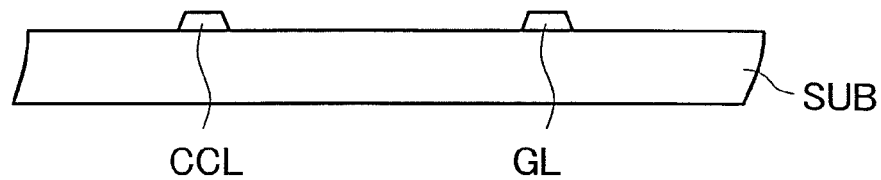
FIG. 4A illustrates a manufacturing process of the array substrate according to the embodiment.
Figure 4B:
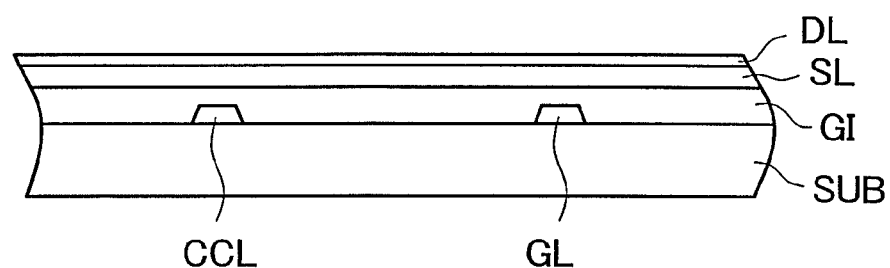
FIG. 4B illustrates the manufacturing process of the array substrate according to the embodiment.
Figure 4C:
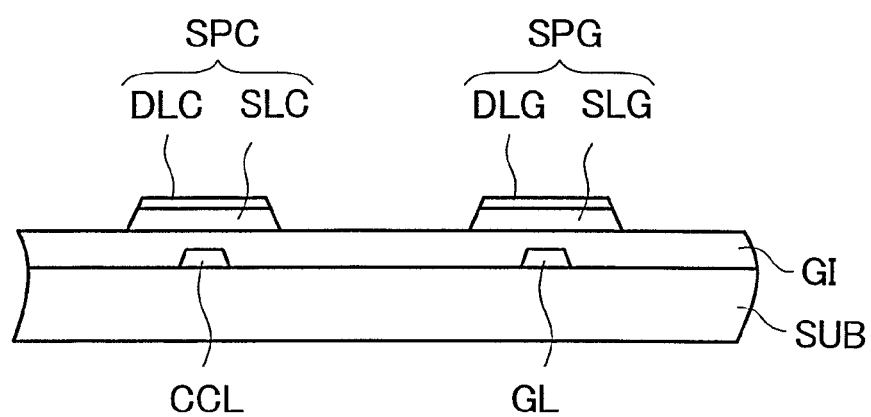
FIG. 4C illustrates the manufacturing process of the array substrate according to the embodiment.

Next, a method for manufacturing the array substrate according to the embodiment will be described. FIGS. 4A to 4C illustrate a manufacturing process of the array substrate according to the embodiment. First, the gate signal line GL or the common connection line CCL is formed on an array substrate SUB. For example, the array substrate SUB is a transparent substrate such as a glass substrate. In this process, a metal serving as the gate signal line GL or the like, for example, a high-melting-point metal such as molybdenum, tungsten, or tantalum, or an alloy thereof is deposited, and patterned by photolithography and etching, whereby the shape of the gate signal line GL or the like is formed (FIG. 4A).

Next, the gate insulating film GI is formed so as to cover the gate electrode film. The gate insulating film GI is made of, for example, silicon dioxide or silicon nitride, and is deposited by a CVD method or the like. A semiconductor layer SL containing amorphous silicon (a-Si) is successively deposited. Thereafter, for forming an impurity-doped semiconductor layer DL (n+ layer), for example, amorphous silicon having a high concentration of phosphorus diffused therein is deposited (FIG. 4B).

Next, the impurity-doped semiconductor layer DL and the semiconductor layer SL are patterned by photolithography and etching to form the inter-wiring semiconductor film SPC or the inter-wiring semiconductor film SPG (FIG. 4C). As an etching technique, plasma ions using a fluorocarbon system gas or the like are employed.

Next, a metal such as, for example, aluminum or an alloy thereof is deposited by sputtering to form a metal film. In this case, for preventing the diffusion of an aluminum film and reducing contact resistance, a layer of a high-melting-point metal such as titanium or molybdenum, or an alloy thereof (barrier metal layer) is preferably formed on and below the aluminum layer. Thereafter, the ground wire PE or the like is formed by photolithography and etching. Next, for example, silicon nitride is deposited by a CVD method as the inter-layer insulating film MI (refer to FIG. 3). After a planarization film is formed, and the contact hole CHC or the like is formed, the common electrode CT is deposited and patterned. An insulating film is deposited thereon, and a contact hole or the like is formed. Thereafter, the pixel electrode PX is formed, whereby a pixel circuit or circuit in the frame region of the IPS type is formed.

Figure 5:
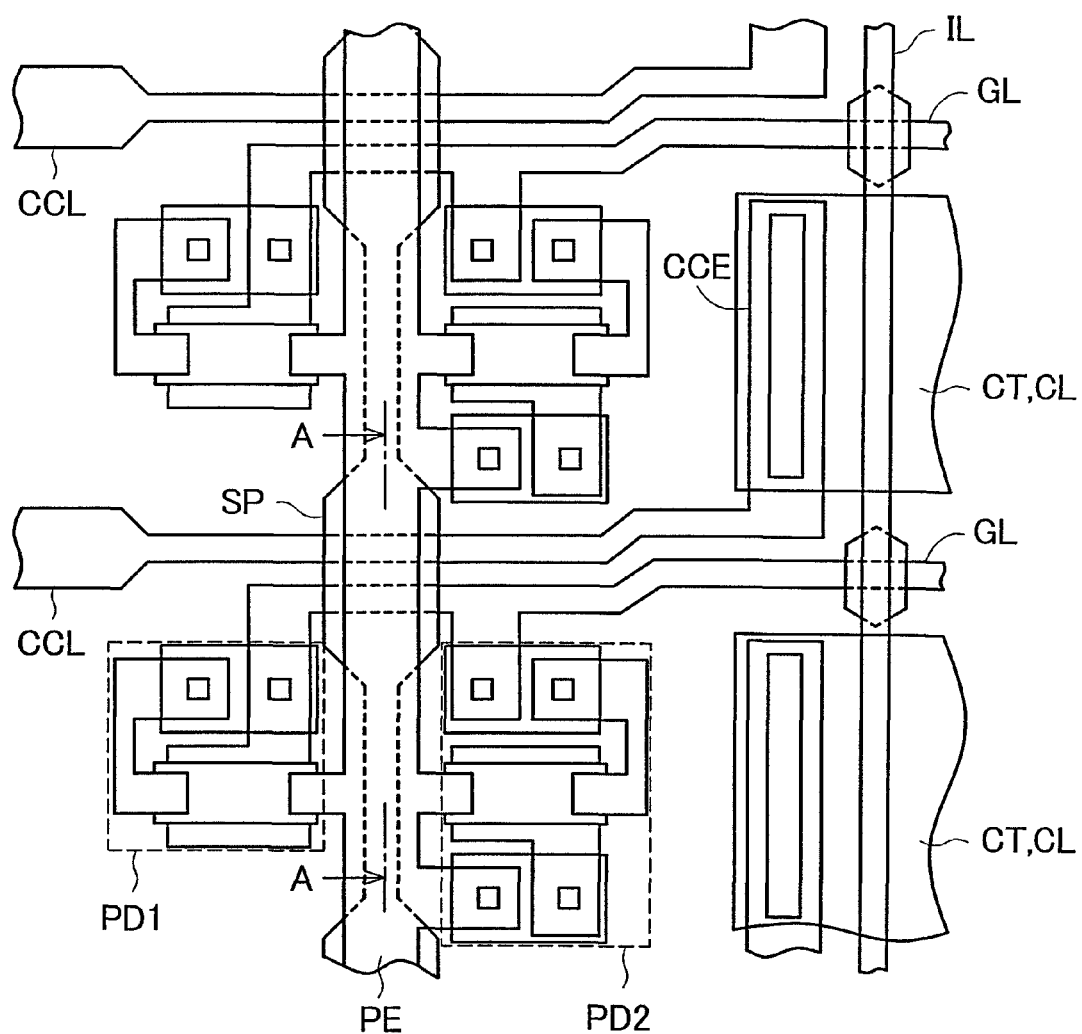
FIG. 5 is a partial plan view of an array substrate for illustrating a subject of the invention.
Figure 6:
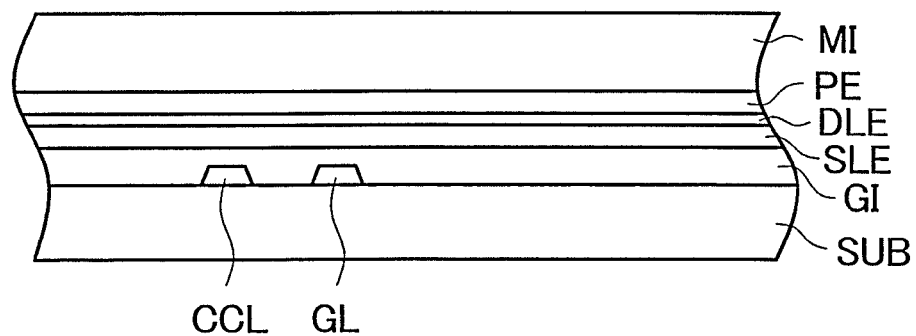
FIG. 6 is a cross-sectional view taken along the line A-A in FIG. 5.
Figure 7:
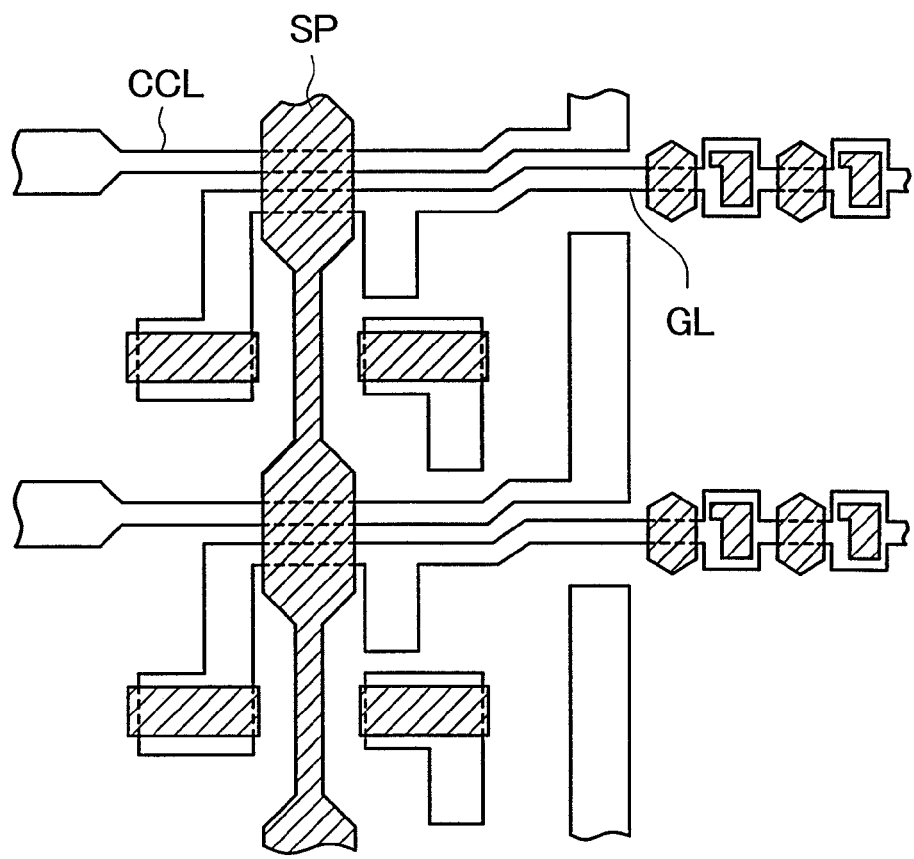
FIG. 7 illustrates an etching process in the array substrate in the subject of the invention.
Figure 8:
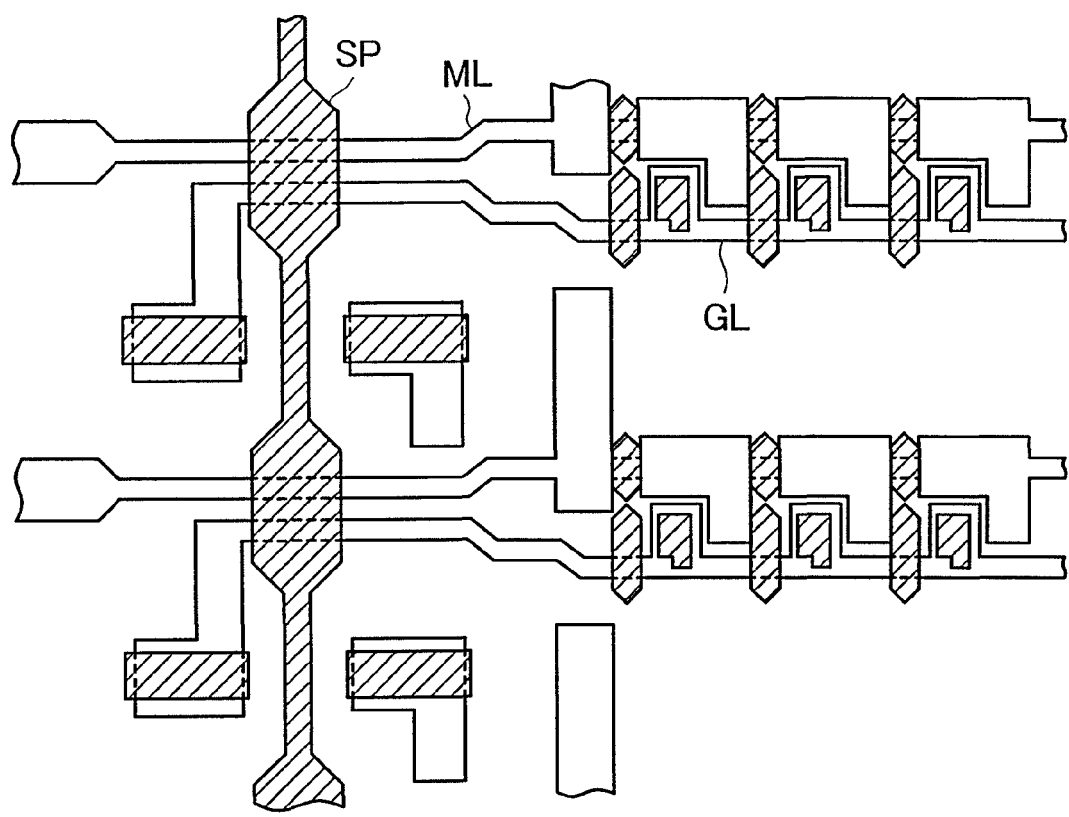
FIG. 8 illustrates an etching process in a conventional array substrate.

By adopting the above-described structure, the inter-wiring semiconductor film SPC formed above the common connection line CCL and the inter-wiring semiconductor film SPG formed above the gate signal line GL are disposed like islands while being separated from each other as shown in FIG. 3. When plasma etching is performed in the manufacturing process as described above, electric charge tends to accumulate on the gate signal line GL and the common connection line CCL as in the case of the configuration shown in FIGS. 5 to 7. Further, a potential difference nearly equal to that of FIG. 7 also occurs due to a remarkable difference in wiring length (for example, a difference of 10 times or more). However, the semiconductor films serving as discharge routes in the structure of FIG. 7 are formed to be separated from each other. Therefore, the resistance between the common connection line CCL and the gate signal line GL is increased to thereby suppress electrostatic discharge. The reasons of the increase in resistance and the suppression of electrostatic discharge will be further described below.

One of the reasons is that the impurity-doped semiconductor layer DL whose conductivity is increased due to the doping of an impurity is separated into the impurity-doped semiconductor film DLC and the impurity-doped semiconductor film DLG in a relatively early stage of etching because the impurity-doped semiconductor layer DL is the upper layer. When the impurity-doped semiconductor layer DL is separated into the impurity-doped semiconductor film DLC and the impurity-doped semiconductor film DLG, the resistance value is increased compared with the case of FIGS. 5 to 7 because the semiconductor layer SL is a semiconductor layer not doped with an impurity. This is one reason why the electrostatic discharge can be suppressed. Another reason is that the inter-wiring semiconductor film SPC and the inter-wiring semiconductor film SPG are separated like islands. In the etching process, the array substrate is exposed to plasma ions for a while after the inter-wiring semiconductor film SPC and the inter-wiring semiconductor film SPG are separated, during which the charging amount of the gate signal line GL or the like may increase. However, it is conceivable that when they are separated like islands, the inter-wiring semiconductor film SPC and the inter-wiring semiconductor film SPG are insulated from each other, and therefore electrostatic discharge can be suppressed.

The invention is not limited to a liquid crystal display device having the structure shown in FIG. 2. In an organic EL display device or the like, for example, electrodes or wires are formed in upper and lower layers which sandwich an organic EL element. Therefore, it may happen that the wiring length is remarkably different between adjacent wires in the same layer when the upper wire is connected to another wire formed in the same layer as the lower layer in a frame region via a contact hole.

What is claimed is:
1. A display device comprising:
a gate signal line;
an image signal line;
a pixel switch connected to the gate signal line and the image signal line in a display region;
a pair of electrodes connected to the pixel switch;
a conductor arranged along the gate signal line;
an insulating layer disposed on the gate signal line and the conductor;
a conductive layer disposed on the insulating layer and crossing the gate signal line and the conductor in a peripheral region;
a first semiconductor film disposed on the insulating layer;

a second semiconductor film disposed on the insulating layer; and a pair of diodes arranged in the peripheral region, and connected to the gate signal line and the conductive layer;

wherein the first semiconductor film is separated from the second semiconductor film;

wherein the first semiconductor film overlaps a first region where the gate signal line crosses the conductive layer;

wherein the second semiconductor film overlaps a second region where the conductor crosses the conductive layer; and wherein the conductive layer is arranged along the image signal line, and the conductive layer is wider than the image signal line.

2. The display device according to claim 1, wherein the gate signal line and the conductor extend to a side of peripheral region; and wherein the display region is closer to an end of the gate signal line in the side of the peripheral region than to an end of the conductor in the side of the peripheral region.

3. The display device according to claim 2, wherein the conductive layer is wider than the gate signal line.

4. The display device according to claim 3 comprising:

a third semiconductor film separated from the first semiconductor film and the second semiconductor film, and disposed on the insulating layer;

wherein the third semiconductor film overlaps a third region where the image signal line crosses the gate signal line; and wherein the first region is larger than the third region.

5. The display device according to claim 4, wherein the second region is larger than the third region.

6. The display device according to claim 5, wherein the first semiconductor film is larger than the third semiconductor film in a plan view.

7. The display device according to claim 6, wherein the second semiconductor film is larger than the third semiconductor film in a plan view.

8. The display device according to claim 7, wherein, along the image signal line, the third semiconductor film has two edges and a central portion which is arranged between two edges; and wherein the two edges are thinner than the central portion.

* * * * *